United States Patent [19]

Trentino

[11] Patent Number: 5,550,509

[45] Date of Patent: Aug. 27, 1996

[54] OUTPUT POWER SELECTION APPARATUS FOR A TUBE-TYPE AUDIO AMPLIFIER

[76] Inventor: Salvatore J. Trentino, 800 Sir Francis Drake Blvd., Suite A, San Anselmo, Calif. 94960

[21] Appl. No.: 371,021

[22] Filed: Jan. 9, 1995

[51] Int. Cl.⁶ ........................................... H03F 3/28
[52] U.S. Cl. ........................... 330/127; 330/123
[58] Field of Search ................... 330/118, 123, 330/127, 128, 134; 381/120

[56] References Cited

U.S. PATENT DOCUMENTS 4,286,492  9/1981  Claret ........................... 330/128

Primary Examiner—Steven Mottola
Attorney, Agent, or Firm—Larry D. Johnson

[57] ABSTRACT

An output power selection apparatus reduces the R.M.S. power output of a tube type amplifier without the use of solid state devices or ganged high or low power potentiometers.

3 Claims, 1 Drawing Sheet

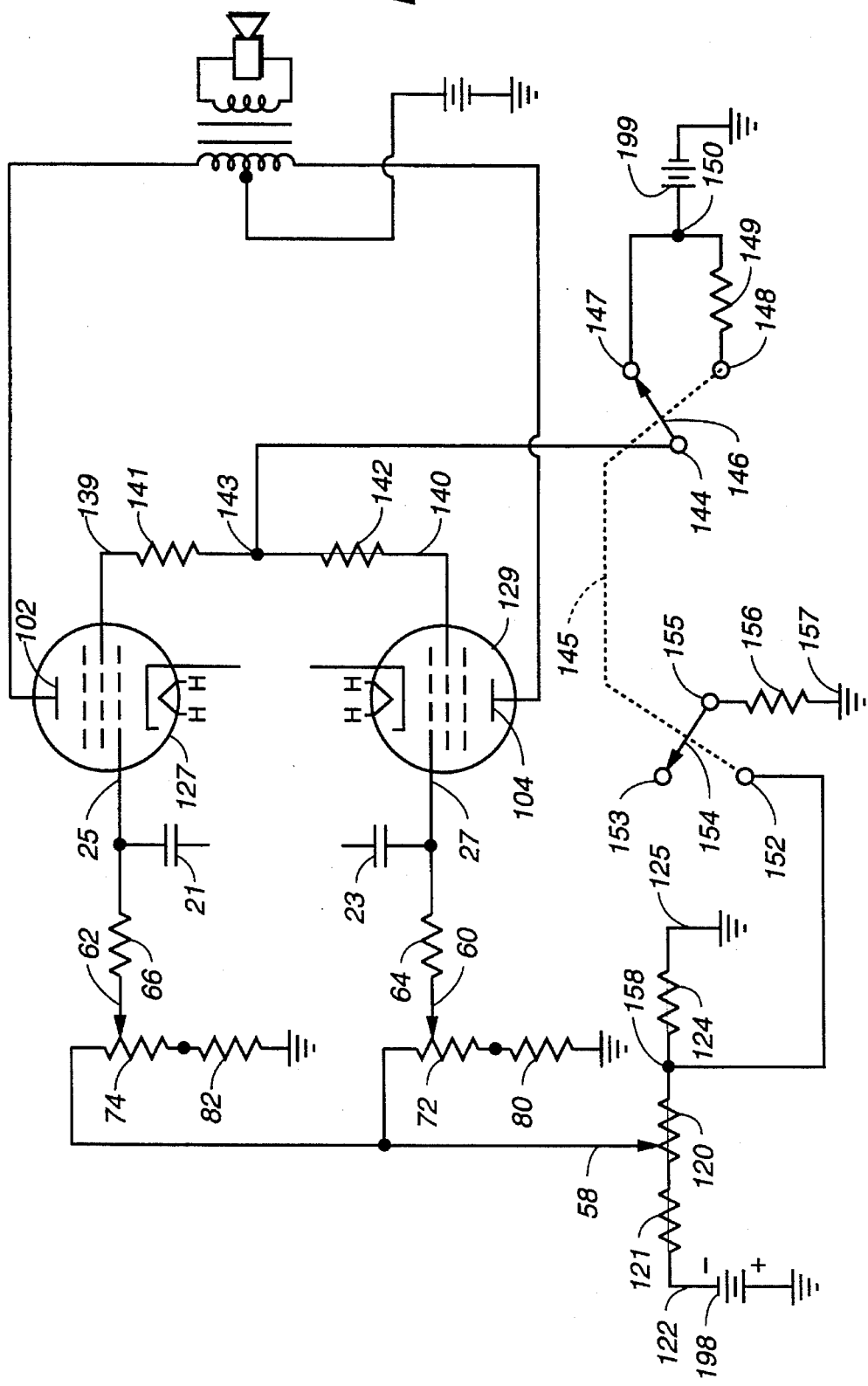
FIG._1

OUTPUT POWER SELECTION APPARATUS FOR A TUBE-TYPE AUDIO AMPLIFIER

This application is related to co-pending applications Ser. No. 08/371,023, for a PHASE INVERTER SELECTION APPARATUS FOR TONE ALTERATION IN A TUBE-TYPE AUDIO AMPLIFIER, and Ser. No. 08/371,022, for an OUTPUT TUBE BIAS SELECTION APPARATUS FOR TONE ALTERATION IN A TUBE-TYPE AUDIO AMPLIFIER, filed concurrently herewith by applicant herein.

BACKGROUND OF THE INVENTION

1. Field of the Invention

This invention relates generally to tube-type audio amplifiers, and more specifically to a high or low R.M.S. output power selection apparatus with no solid state devices employed.

2. Description of the Prior Art

It would be very advantageous to be able to control the maximum R.M.S. output power of a push pull tube type guitar audio amplifier output section. Attempts have been made in the past to achieve this goal. In the previous art, however, there were certain shortcomings associated with the topology of these attempts. Those shortcomings include the use of transistors to regulate the voltage supply to the screen grids of the pentode or beam power type output tubes, and also varying the control grid DC voltage. The use of such transistors destroys the claim of the amplifier being an "all tube" type device. Many audio purists and guitarists shun amplifiers which employ transistors anywhere in the signal path. And while some would argue that transistorized screen grid regulation is not in the signal path, this seems to be a matter of conjecture. Nevertheless, purists do not seem to care about the finer points of this transistor placement argument; if there is a transistor on the amplifier chassis anywhere, it is not an "all tube" amplifier in their eyes.

Another power limiting approach is the use of large, high powered potentiometers to control the screen grid voltage in pentode or beam power output tubes. However, considering the fact that the screen grid of such output tubes can dissipate up to seven or more watts, if four output tubes are employed (which is common), at least a thirty watt potentiometer would be required to sustain normal power dissipations, and if the potentiometer is to withstand the large peak currents which can flow during output tube malfunctions and failures, somewhere in the vicinity of a one hundred watt potentiometer might be needed. This is a large and expensive component, and would take up much valuable space in the chassis. For these reasons, the large potentiometer approach is unattractive.

SUMMARY OF THE INVENTION

The output power selection apparatus of this invention reduces the R.M.S. power output of a tube type amplifier without the use of solid state devices or ganged high or low power potentiometers.

BRIEF DESCRIPTION OF THE DRAWINGS

FIG. 1 is a schematic view of output power selection circuitry for a tube-type audio amplifier.

DETAILED DESCRIPTION OF A PREFERRED EMBODIMENT

With reference to FIG. 1, let us consider just one of the usual pentode or beam power output tubes 127. Its screen grid 139 has a screen grid current limiting resistor 141 connected to point 143 which is connected to point 144, and then to wiper 146 of one side of the multi-pole power limiting switch 145. In the high power position of switch 145, the screen grid of tube 127 is connected directly to the screen grid voltage supply represented by 199 via point 150 through its screen grid current limiting resistor 141 through terminals 143, 144, 147 and 150. Also, in the high power mode, the C- control grid bias supply 198 (here represented by a battery), is fed to the control grid 25 of the tube 127 via points 121, 120, 58, 74, 66, to point 25.

In the low R.M.S. power mode of this invention, the wiper 146 of the screen grid control side of the power reduction switch 145 is connected to the pole 148, which inserts a power resistor 149 in the series with the voltage path from the screen grid voltage supply 199 via 150 to the rest of the screen grid supply circuits. This added resistor reduces the screen grid 139 voltage to the output tube 127 and substantially reduces the plate 102 dissipation possible in that tube 127, thus also reducing the R.M.S. power capability at the same time. Simultaneously, the other wiper 154 of the multi-pole power reduction switch 145 (which is the C- grid bias side of that switch) has moved over to the pole 152 (pole 153 is the unused position) which connects the shunting resistor 156 into the voltage divider path in the C- supply to accommodate the reduced screen grid voltage condition established by the other side 146, 147, 148 of the same switch. The point 152 is connected to point 158 of the C-bias network. This makes the C- bias supply less negative by causing more D.C. voltage drop to occur across the resistors 120 and 121.

The above discussion was for only one of the multiplicity of output tubes which could be employed. In the accompanying drawings, two output tubes are shown in push-pull arrangement, however, any number of output tubes could be used. While the above description applies to only one of the two output tubes shown in the drawing, the same analysis and procedures apply to all the output tubes employed, whatever the number used.

The following is a brief description of the remaining components illustrated in FIG. 1: AC signal coupling capacitor 21 conveys the signal to be amplified from the previous stages to the control grid 25 of output tube 127. AC signal coupling capacitor 23 conveys the signal to be amplified from the previous stages to the control grid 27 of output tube 129, which includes anode (plate) connection 104 and screen grid connection 140 connected to screen grid bias resistor 142. Individual bias control potentiometer 74 includes wiper contact 62. Resistor 64 allows the control grid 27 of output tube 129 to be properly DC biased either to the C- supply (in the fixed biased mode) or toward common ground (in the self biased mode). Individual C- bias voltage control potentiometer 72 for the control grid 27 of output tube 129 includes wiper contact 60. Resistor 80 in the C- bias control potentiometer's 72 path for output tube 129 prevents an out of range bias voltage from inadvertently being selected, and thereby damaging output tube 129. Resistor 82 in the C- bias control potentiometer's 74 path for the output tube 127 prevents an out of range bias voltage from inadvertently being selected, and thereby damaging output tube 127. C- bias supply negative voltage is introduced at point 122. The positive side of this C- supply is connected to the common ground point 157. Resistor 124 in the C- bias control potentiometer's path 120 prevents an out of range bias voltage from inadvertently being selected by this potentiometer 120. Common ground connection 125 (B supply minus and C supply plus attach here) is the low side of resistor 124. Wiper connection point 155 of the power level selector switch 145 is used to select a less negative C-bias voltage when this switch is in the lower power position. Common ground point 157 in the circuit is the low side of resistor 156 (B supply minus and C supply plus connect here also). Junction point 158 in the C- bias supply resistor voltage divider chain is the take off point to pole 152 on the power reduction switch.

There is another factor to deal with in reducing the R.M.S. power. When the screen grid voltage is appreciably reduced, to keep the output tube within a relatively linear portion of its transfer curve, the negative control grid voltage (C-supply) must be adjusted to accommodate the lowering of the screen grid supply voltage. This is most easily accomplished through the use of a shunting resistor switched into a voltage divider network located in the C- grid bias supply whenever the screen grid voltage supply is reduced, as mentioned above. This shunting resistor is engaged by a set of poles of a multi-pole switch mechanically connected to the bat lever of the same switch that accomplishes the reduction of screen grid voltage.

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims.

What is claimed as invention is:

1. An output power selection apparatus for a tube-type audio amplifier, said apparatus comprising:

an output tube having a screen grid and a control grid;

a screen grid voltage supply;

a control grid bias supply; and a power reduction switch selectively connecting said output tube screen grid directly to the screen grid voltage supply through a current limiting resistor, and connecting said output tube control grid to the control grid bias supply whose potential voltage is at the more negative of two selectable voltage level values for high power operation, and connecting said output tube screen grid to the screen grid power supply through a power limiting resistor connected to said current limiting resistor, and the output tube control grid to the less negative of two selectable voltage levels for low power operation.

2. The output power selection apparatus of claim 1 wherein said power reduction switch includes a first set of poles for selectively connecting said output tube screen grid to the greater or lesser of two screen grid supply currents, and a second set of poles for adding or disconnecting a shunting resistor in the control grid bias supply resistor divider chain, said shunting resistor selecting the more or less negative control grid voltage as required for the high or low power operation being selected.

3. The output power selection apparatus of claim 1 wherein said power reduction switch is connnnected to a plurality of output tubes.

* * * * *